United States Patent
Beck et al.

(10) Patent No.: US 7,691,736 B2
(45) Date of Patent: Apr. 6, 2010

(54) MINIMIZING LOW-K DIELECTRIC DAMAGE DURING PLASMA PROCESSING

(75) Inventors: Michael Beck, Poughkeepsie, NY (US); John A. Fitzsimmons, Poughkeepsie, NY (US); Karl Hornik, Laaber (DE); Darryl Restaino, Modena, NY (US)

(73) Assignee: Infineon Technologies AG, Munich (DE)

( * ) Notice: Subject to any disclaimer, the term of this patent is extended or adjusted under 35 U.S.C. 154(b) by 496 days.

(21) Appl. No.: 11/352,047

(22) Filed: Feb. 10, 2006

(65) Prior Publication Data

US 2007/0190804 A1    Aug. 16, 2007

(51) Int. Cl.
*H01L 21/4763* (2006.01)

(52) U.S. Cl. ........................ 438/622; 438/627; 438/628; 438/629; 438/654; 438/687; 438/683; 257/760; 257/E21.257; 257/E21.261; 257/E21.271; 257/E21.292

(58) Field of Classification Search ................. 438/778, 438/627–629, 654, 683, 687, 791, 792; 257/760, 257/E21.257, 261, 271, 292

See application file for complete search history.

(56) References Cited

U.S. PATENT DOCUMENTS

| | | | |
|---|---|---|---|
| 6,147,009 A * | 11/2000 | Grill et al. ................. 438/780 |
| 6,261,951 B1 * | 7/2001 | Buchwalter et al. ......... 438/644 |
| 6,784,485 B1 * | 8/2004 | Cohen et al. ................. 257/325 |
| 6,806,182 B2 | 10/2004 | Restaino et al. | |
| 6,939,797 B2 * | 9/2005 | Barth et al. ................. 438/628 |
| 7,223,692 B2 * | 5/2007 | Lin et al. ..................... 438/672 |
| 2004/0130035 A1 * | 7/2004 | Wu et al. ..................... 257/774 |
| 2004/0173908 A1 * | 9/2004 | Barth et al. ................. 257/760 |
| 2004/0259378 A1 * | 12/2004 | Chambers et al. ........... 438/771 |
| 2005/0059258 A1 * | 3/2005 | Edelstein et al. ............ 438/758 |
| 2005/0208776 A1 * | 9/2005 | Krishnan et al. ............ 438/770 |
| 2005/0221628 A1 * | 10/2005 | Tanaka et al. ............... 438/791 |
| 2005/0230831 A1 * | 10/2005 | Clevenger et al. ........... 257/751 |
| 2005/0233514 A1 * | 10/2005 | Bu et al. ..................... 438/199 |
| 2006/0024873 A1 * | 2/2006 | Nandakumar et al. ....... 438/197 |
| 2006/0046479 A1 * | 3/2006 | Rajagopalan et al. ....... 438/683 |
| 2006/0194430 A1 * | 8/2006 | Beck ........................... 438/627 |
| 2007/0012661 A1 * | 1/2007 | Vasilyeva et al. ............. 216/67 |
| 2007/0042588 A1 * | 2/2007 | Beck et al. .................. 438/597 |
| 2007/0105368 A1 * | 5/2007 | Tsui et al. ................... 438/624 |

* cited by examiner

*Primary Examiner*—Thao X Le
*Assistant Examiner*—Eric W Jones
(74) *Attorney, Agent, or Firm*—Slater & Matsil, L.L.P.

(57) ABSTRACT

Embodiments of the invention provide a semiconductor device having dielectric material and its method of manufacture. A method comprises a short (≦2 sec) flash activation of an ILD surface followed by flowing a precursor such as silane, DEMS, over the activated ILD surface. The precursor reacts with the activated ILD surface thereby selectively protecting the ILD surface. The protected ILD surface is resistant to plasma processing damage. The protected ILD surface eliminates the requirement of using a hard mask to protect a dielectric from plasma damage.

27 Claims, 3 Drawing Sheets

MINIMIZING LOW-K DIELECTRIC DAMAGE DURING PLASMA PROCESSING

TECHNICAL FIELD

This invention relates generally to semiconductor device manufacturing and more particularly to the formation and processing of low-k dielectric films and interconnect structures.

BACKGROUND

In semiconductor devices, aluminum and aluminum alloys have been used as the traditional interconnect metallurgies. While aluminum-based metallurgies have been the material of choice for use as metal interconnects over the past years, concern now exists as to whether aluminum will meet the demands required as circuit density and speeds for semiconductor devices increase. Because of these growing concerns, other materials have been investigated as possible replacements for aluminum-based metallurgies.

One highly advantageous material now being considered as a potential replacement for aluminum metallurgies is copper, because of its lower susceptibility to electromigration failure as compared to aluminum, as well as its lower resistivity. Despite these advantages, copper suffers from an important disadvantage. Copper readily diffuses into the surrounding dielectric material during subsequent processing steps. To inhibit the diffusion of copper, copper interconnects are often capped with a diffusion barrier layer. One method of capping involves the use of a conductive barrier layer of tantalum, titanium or tungsten, in pure or alloy form, along the sidewalls and bottom of the copper interconnection. To cap the upper surface of the copper interconnection, a dielectric material such as silicon nitride is typically employed.

A typical interconnect structure using low-k dielectric material and copper interconnects is shown in FIG. 1. The interconnect structure comprises a lower substrate 10 which may contain logic circuit elements such as transistors. A dielectric layer 12, commonly known as an inter-layer dielectric (ILD), overlies the substrate 10. In advanced interconnect structures, ILD layer 12 is preferably a low-k polymeric thermoset material such as SiLK™ (an aromatic hydrocarbon thermosetting polymer available from The Dow Chemical Company). An adhesion promoter layer 11 may be disposed between the substrate 10 and ILD layer 12. A layer of silicon nitride 13 may be disposed on ILD layer 12. Silicon nitride layer 13 is commonly known as a hardmask layer or polish stop layer. At least one conductor 15 is embedded in ILD layer 12. Conductor 15 is typically copper in advanced interconnect structures, but may alternatively be aluminum or other conductive material. A diffusion barrier liner 14 may be disposed between ILD layer 12 and the conductor 15. Diffusion barrier liner 14 is typically comprised of tantalum, titanium, tungsten or nitrides of these metals. The top surface of conductor 15 is made coplanar with the top surface of silicon nitride layer 13, usually by a chemical-mechanical polish (CMP) step. A cap layer 17, also typically of silicon nitride, is disposed on conductor 15 and silicon nitride layer 13. Silicon nitride cap layer 17 acts as a diffusion barrier to prevent diffusion of copper from conductor 15 into the surrounding dielectric material.

A first interconnect level is defined by adhesion promoter layer 11, ILD layer 12, silicon nitride layer 13, diffusion barrier liner 14, conductor 15, and cap layer 17 in the interconnect structure shown in FIG. 1. A second interconnect level, shown above the first interconnect level in FIG. 1, includes adhesion promoter layer 18, ILD layer 19, silicon nitride layer 20, diffusion barrier liner 21, conductor 22, and cap layer 24.

The first and second interconnect levels may be formed by conventional damascene processes. For example, formation of the second interconnect level begins with deposition of adhesion promoter layer 18. Next, the ILD material 19 is deposited onto adhesion promoter layer 18. If the ILD material is a low-k polymeric thermoset material such as SiLK™, the ILD material is typically spin-applied, given a post apply hot bake to remove solvent, and cured at elevated temperature. Next, silicon nitride layer 20 is deposited on the ILD. Silicon nitride layer 20, also known as a hardmask layer or polish stop layer, is patterned by conventional photolithography techniques, and then acts as a mask during subsequent etching of ILD layer 19, adhesion promoter layer 18 and cap layer 17, to form at least one trench and via. The trenches and vias are typically lined with diffusion barrier liner 21. The trenches and vias are then filled with a metal such as copper to form the conductor 22 in a conventional dual damascene process. Excess metal is removed by a CMP process. The silicon nitride layer 20 acts as a polish stop layer during the CMP process. Finally, silicon nitride cap layer 24 is deposited on copper conductor 22 and silicon nitride layer 20.

It is well understood in the semiconductor arts that a pre-clean before cap deposition enhances the reliability of an integration structure by improving the conductor/cap interface. However, the newer low-k and extreme low k (ELK) porous dielectrics are more susceptible to processing damage than conventional ILD layers. One solution is to use a hardmask to cover and protect the ILD. Such a hardmask is typically a permanent part of the interconnect structure, so it affects the effective dielectric constant of the entire ILD stack. Since an ILD hardmask is denser or constructed of higher Z materials than the low-k dielectric, the net effect is to increase the effective dielectric constant of the ILD stack, thereby partially defeating the advantage gained from the low-k dielectric. The hard mask may also require additional processing or tooling.

Therefore, there remains a need for improved methods and systems for protecting low-k dielectrics without increasing the effective dielectric constant of the ILD stack.

SUMMARY OF THE INVENTION

These and other problems are generally solved or circumvented, and technical advantages are generally achieved, by preferred embodiments of the present invention that provide methods and systems for protecting sensitive low-k dielectric layers without significantly raising the k-value of an integration structure.

An embodiment of the invention provides a semiconductor fabrication method. A method comprises providing a substrate having active devices formed therein. A dielectric layer, preferably a low-k dielectric, is formed over the substrate. Embodiments include exposing a surface of the dielectric layer to a plasma, thereby forming a chemically reactive surface. The plasma is turned off after forming the chemically reactive surface. Embodiments include exposing the chemically reactive surface to a gaseous precursor after turning off the plasma. The gaseous precursor reacts with the chemically reactive surface.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making, operation, and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Exemplary materials, structures, and methods are provided below for fabricating a semiconductor device that has damascene interconnect structure. Although the exemplary embodiments are described as a series of steps, it will be appreciated that this is for illustration and not for the purpose of limitation. For example, some steps may occur in a different order than illustrated yet remain within the scope of the invention. Also, not all illustrated steps are necessarily required to implement the invention. Furthermore, the materials, structures, and methods according to embodiments of the invention may be implemented in areas other than semiconductor manufacturing.

The present invention will now be described with respect to preferred embodiments in a specific context, namely, specific steps in the manufacture of semiconductor structure comprising multiple level copper metallization formed by way of a damascene process such described in U.S. Pat. No. 6,939,797, which patent is hereby incorporated by reference in its entirety. It is believed that embodiments of this invention are advantageous when used in a damascene metallization process. It is further believed that embodiments described herein will benefit other manufacturing applications involving low-k films or dielectrics not specifically illustrated.

Figure 1:
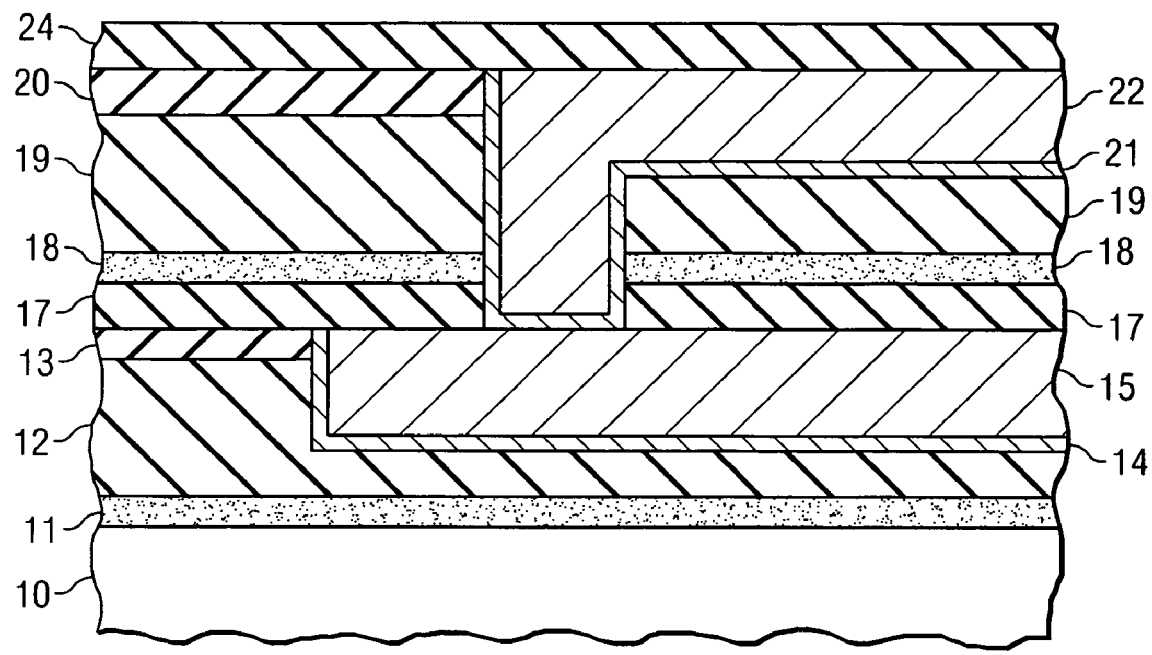
FIG. 1 is a schematic cross-sectional view of a partially-fabricated semiconductor device illustrating a prior art interconnect structure.
Figure 2:
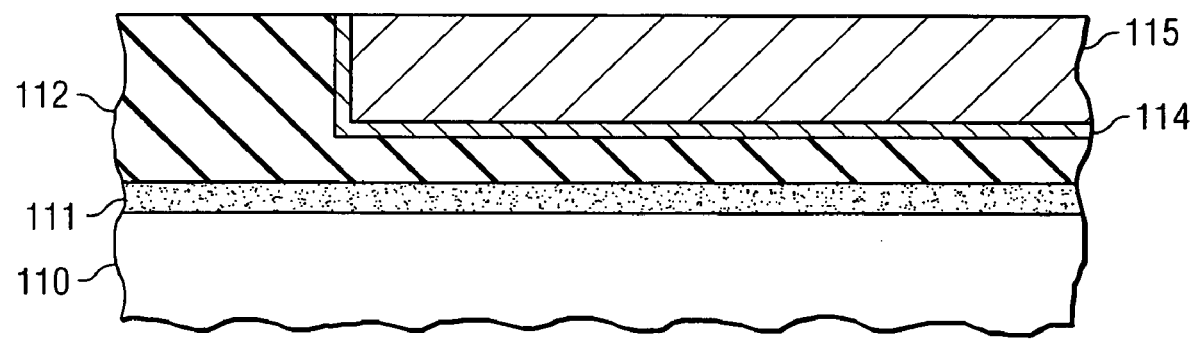
FIG. 2 is a cross-sectional view of a conductor formed in an opening within a low-k ILD according to embodiments of the invention.

Referring to FIG. 2, there is illustrated a semiconductor device having an interconnect structure at an intermediate fabrication stage. A preferred embodiment of the interconnect structure of this invention comprises a substrate 110 that may contain active devices such as transistors, which may be completely or partially completed. An adhesion promoter layer 111 is optionally deposited by any suitable method upon the substrate 110. For example, if adhesion promoter layer 111 is formed of DEMS-Oxide, the adhesion promoter solution may be applied in-situ by the CVD process, followed by the main dielectric deposition. The dielectric layer 112, commonly known as an inter-layer dielectric (ILD), overlies the substrate 110.

An ILD layer 112 is formed over the substrate 110. The ILD layer may be formed using any suitable dielectric material although low-k dielectric materials are preferred. Suitable dielectric materials include carbon-doped silicon dioxide materials; fluorinated silicate glass (FSG); organic polymeric thermoset materials, silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Forming the dielectric layer may include using precursors such as silane ($SiH_4$), a tetraethylorthosilicate (TEOS), or diethoxymethylsilane (DEMS), for example. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELK) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell). The ILD layer 112 may be about 100 nm to about 1000 nm thick, but it is preferably about 600 nm thick. The dielectric constant for ILD layer 112 is preferably about 1.8 to about 3.5, and most preferably about 2.5 to about 2.9.

Alternatively, ILD layer 112 is more preferably formed of a porous dielectric material, such as MesoELK™ (available from Air Products) and XLK™ (a porous version of FOx, available from Dow Corning). For example, if ILD layers 112 is formed of such porous dielectric material, the dielectric constant of these layers is preferably less than about 2.6, and is most preferably about 1.5 to 2.5. It is particularly preferred to use an organic polymeric thermoset material having a dielectric constant of about 1.8 to 2.2. If SiLK™ is used for ILD layer 112, the resin may be applied by a spin-coating process, followed by a baking step to remove solvent and then a thermal curing step.

At least one trench is formed using a conventional photolithography patterning and etching process within the ILD 112. The trench is preferably lined with diffusion barrier liner 114, and then a conductive material is deposited in the trench to form conductor 115. Diffusion barrier liner 114 may be deposited by any suitable method, such as by physical vapor deposition (PVD), chemical vapor deposition (CVD) or ionized physical vapor deposition (i-PVD) or atomic layer deposition (ALD) or i-ALD. Diffusion barrier liner 114 may be a multi-layer liner constructed by depositing several refractory metals as a thin film composite. Diffusion barrier liner 114 may comprise one or more of the following materials: tantalum, titanium, tungsten and the nitrides of these metals. Conductive material 115 may be deposited in trench by any suitable method, such as by plating technology. The conductor 115 may be formed of any suitable conductive material, such as copper or aluminum. Copper is particularly preferred as the conductive material, due to its relatively low resistance. The conductor 115 may contain small concentrations of other elements. Excess liner 114 and conductive material 115 may be removed with a chemical mechanical polishing (CMP) process, thereby producing the structure shown in FIG. 2.

Conventional methods may include protecting the ILD layer 112 with a hardmask during subsequent processing. Low-k dielectrics, for example, are susceptible to damage from plasma etching and ashing processes. Such plasma processes include etching, removing photoresist masks, PECVD depositions, and plasma cleaning. One such plasma cleaning step removes oxide, e.g., CuO, from the surface of the conductor 115. Without a hardmask layer, the plasma easily damages the surface of the ILD layer 112.

Preferred embodiments of the invention advantageously dispense with the requirement of using a hardmask to protect an ILD during plasma processing. Embodiments provided below include selectively treating the ILD 112. The treated or protected surface is more robust and able to withstand subsequent plasma processing such as oxide removal, or pre-cleaning, ashing, deposition, and other plasma operations.

Figure 3A:
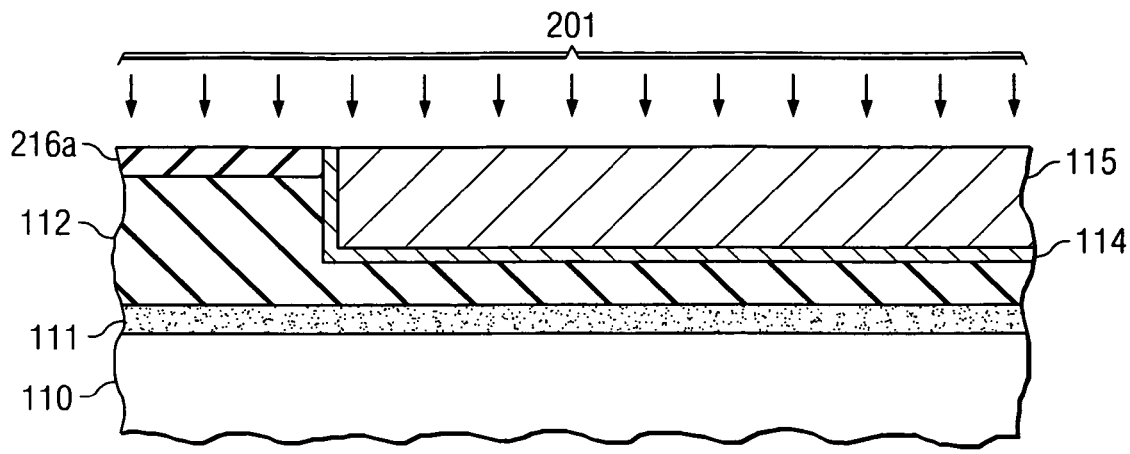
FIGS. 3a and 3b are cross-sectional views of ILD surface activation and precursor reaction according to embodiments of the invention.
Figure 3B:
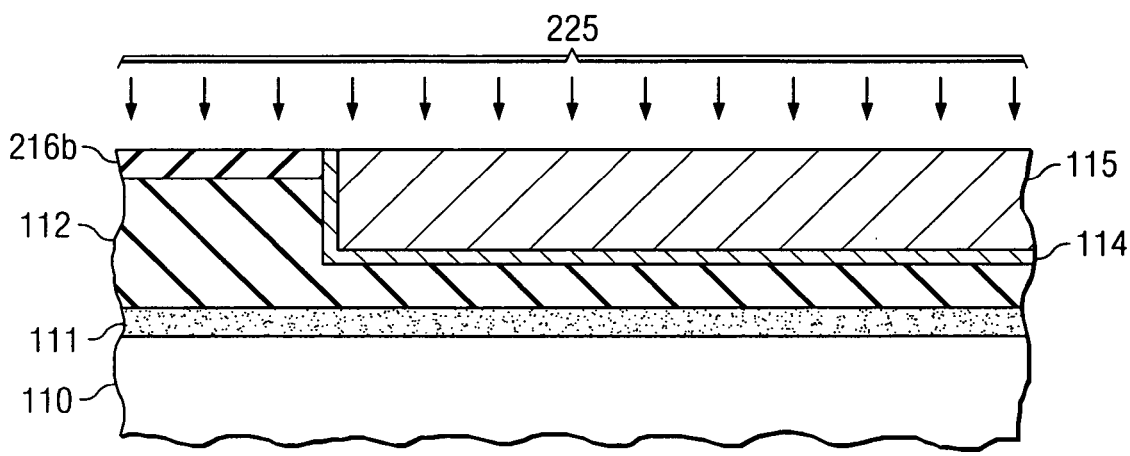

Turning now to FIGS. 3a and 3b, preferred embodiments of the invention include performing a flash activation 201 that forms an activated surface 216a on the ILD layer 112. The flash activation 201 comprises a plasma process of suitably short duration so that the ILD layer 112 is activated, but not unduly damaged. While not intending embodiments of the invention to be limited to any proposed theory of operation, the activated surface 216a may include dangling atomic bonds, such as silicon dangling bonds. The activated surface 216a may include not just a monolayer of atoms at the surface. For example, the activated surface 216a may include a surface region at the surface of the ILD layer 112. The surface region may be between about 1 nm and about 10 nm thick, for example. In preferred embodiments, activating the surface advantageously converts it from hydrophilic to hydrophobic.

The plasma is preferably a reducing plasma such as $H_2$, $N_2$, $NH_3$ and/or noble gases. Of these reducing plasmas, $NH_3$ is most preferred. This exposure step is carried out at a temperature in the range of about 20 to about 600° C. The reaction chamber pressure is between about 1 mtorr and about 20 torr. The RF power is in the range of about 10 W to about 1,000 W. The gas flow rate is in the range of about 1 to about 10,000 sccm. In an embodiment, the flash activation 201 is performed at between about 300° C. and about 400° C., preferably about 350° C. for less than about 2 sec. The pressure is between about 1 torr and about 10 torr, preferably about 3 torr. A preferred high frequency RF power is preferably about 640 W. The gas comprises $NH_3$ and $N_2$, and the flow rate of each gas is between about 1000 sccm and 2000 sccm, preferably about 1600 sccm.

Turning now to FIG. 3b, the activating plasma is turned off. Immediately thereafter and without opening the process chamber, a precursor gas 225 is flowed over the activated surface where it reacts with dangling bonds, thereby replacing the activated surface 216a with a protected surface 216b on the ILD layer 112. Preferred precursor gases include, $SiH_4$, $NH_3$, $N_2$, trimethylsilane (3MS), diethoxymethylsilane (DEMS), and/or tetramethylsilane (4MS). A typical deposition process uses a flow of DEMS in the range of about 50 sccm to about 500 sccm. In other embodiments, the precursor gases may include dielectric precursors and materials for forming dielectric layer.

In a preferred embodiment, the precursor gas reaction step is performed at about 350° C. The precursor gas may have a flow rate between about 10 sccm and about 1,000 sccm. In an embodiment, the precursor gas comprises a 3MS flow between about 300 sccm and about 500 sccm. The pressure is about 3 torr, and the reaction time is about 30 seconds. In an alternative embodiment, the precursor gas may comprise $SiH_4$ having a flow rate between about 200 sccm and about 400 sccm. The pressure may be between about 1 torr and about 10 torr, preferably about 3 torr. The reaction time may be less than about 10 minutes, preferably less than about 1 minute, more preferably less than about 30 seconds.

Figure 4:
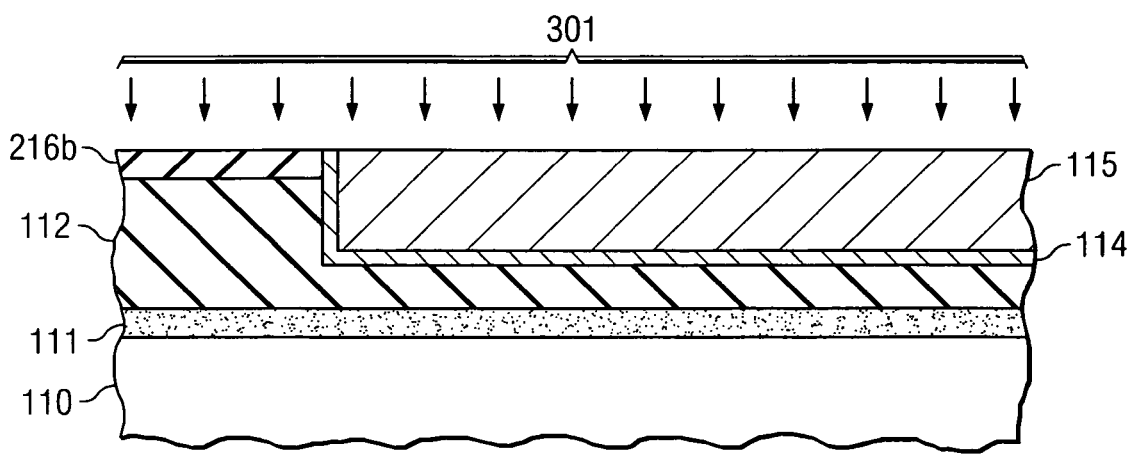
FIG. 4 is a cross-sectional view of oxide removal from a conductor according to embodiments of the invention.

Turning now to FIG. 4, in preparation for forming a capping layer, an oxide removal step, which may also be called pre-cleaning, is performed to improve adhesion of the capping layer to the conductor. A conventional oxide removal process is described in U.S. Pat. No. 6,261,951, which is incorporated by reference in its entirety.

Unlike conventional oxide removal methods wherein the plasma exposure time is in the range of about 1 to about 3600 seconds, the exposure time is less than about 5 seconds in preferred embodiments. This is to preserve the dielectric protection layer 216b in a subsequent cap layer forming process. In preferred embodiments, the oxide removal occurs without deposition of any materials, such as a pre-cleaning layer as in conventional methods. Suitable reaction conditions include a reducing plasma with a substrate temperature between about 300° C. and about 400° C., a combination of $NH_3$ and $N_2$ with each gas having a flow rate between about 1000 sccm and about 2000 sccm, a chamber pressure between about 1 torr and about 10 torr, and a high frequency RF power between about 500 W and about 600 W. Preferred reaction conditions include a temperature of about 350° C., a flow rate of about 1600 sccm, a chamber pressure of about 3 torr, and a high frequency RF power of about 550 W.

Figure 5:
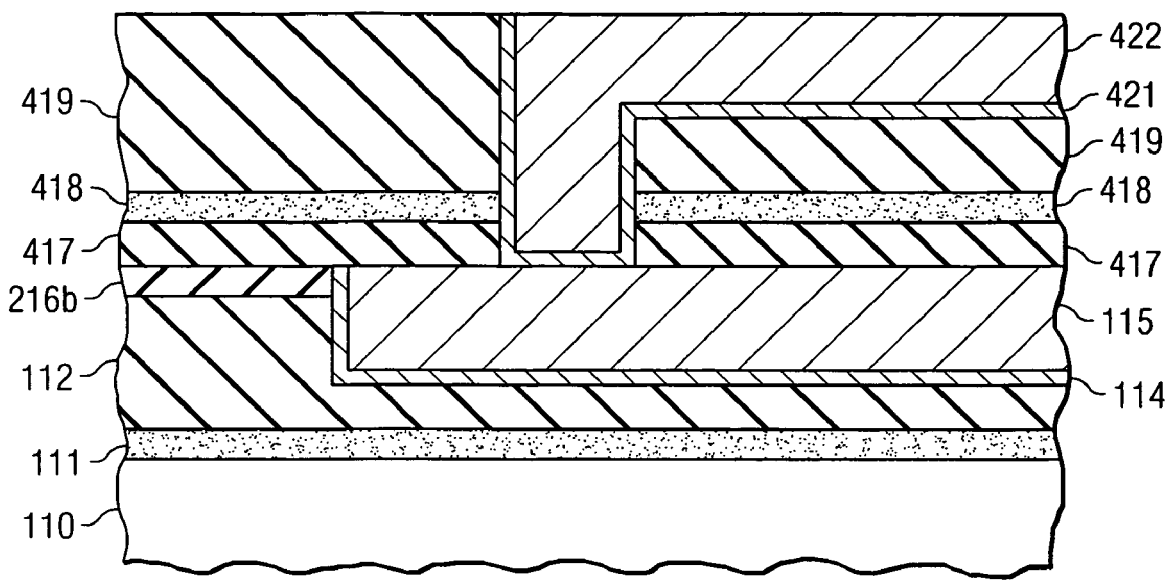
FIGS. 5-6 are schematic cross-sectional views of the completion of an interconnect structure according to embodiments of the invention.

Turning now to FIG. 5, a cap layer 417 is formed on the structure shown in FIG. 4. The cap layer 417 forms a diffusion barrier between the conductor and the surrounding dielectric. The cap layer 417 should be deposited in the same PECVD reaction chamber as was used for the oxide removal step, by effecting a gas exchange such that a PECVD silicon nitride layer is deposited directly on the pre-cleaned surface of copper conductor 115. In a preferred embodiment, cap layer 417 is a silicon nitride film deposited in a CVD reactor at a pressure in the range of about 0.1 to 10 torr, using a combination of gases that may include, but is not limited to, $SiH_4$, $NH_3$, $N_2$ and/or He. A preferred deposition uses a flow of 3MS in the range of about 10 to 500 sccm, a flow of NH3 in the range of about 100 to 3000 sccm, and a flow of He in the range of about 500 to 25000 sccm. The deposition temperature may be in the range of about 150 to 500° C., but more preferably less than about 350° C. to preserve the dielectric protection layer. The high frequency RF power is typically in the range of about 25 to 700 watts per showerhead. The final deposition thickness is preferably in the range of about 10 to 100 nm, most preferably in the range of about 25 nm to 70 nm.

Next, a conventional via and trench are formed in ILD layer 419. First, at least one via may be formed in ILD layer 419 adhesion promoter layer 418, cap layer 417 using a conventional photolithography patterning and etching process. Then, at least one trench may be formed in a portion of ILD layer 419, using a conventional photolithography process. The via and trench may be formed using the same photolithography process as that used to form the trench in the first ILD layer 112.

Continuing with FIG. 5, the via and trench are preferably lined with diffusion barrier liner 421, and then a conductive material is deposited in the via and trench to form conductor 422. Diffusion barrier liner 421 may be deposited by the same method used for diffusion barrier liner 114, and conductive material 422 may deposited by the same method used for conductor 115. Excess liner 421 and conductive material 422 may be removed in a CMP process, in which the top surface of conductor 422 is made coplanar with the ILD 419. Thereby producing the structure of FIG. 5.

In a conventional process, a sacrificial hardmask layer (not shown) on ILD 422 may serve as a polish-stop layer during this CMP step. Again, it is important that the sacrificial hardmask layer remain continuous after the CMP step in the conventional process. In preferred embodiments, ILD layer 422 provides a polish stop layer, and a hardmask is not required, as is shown in FIG. 5.

Figure 6:
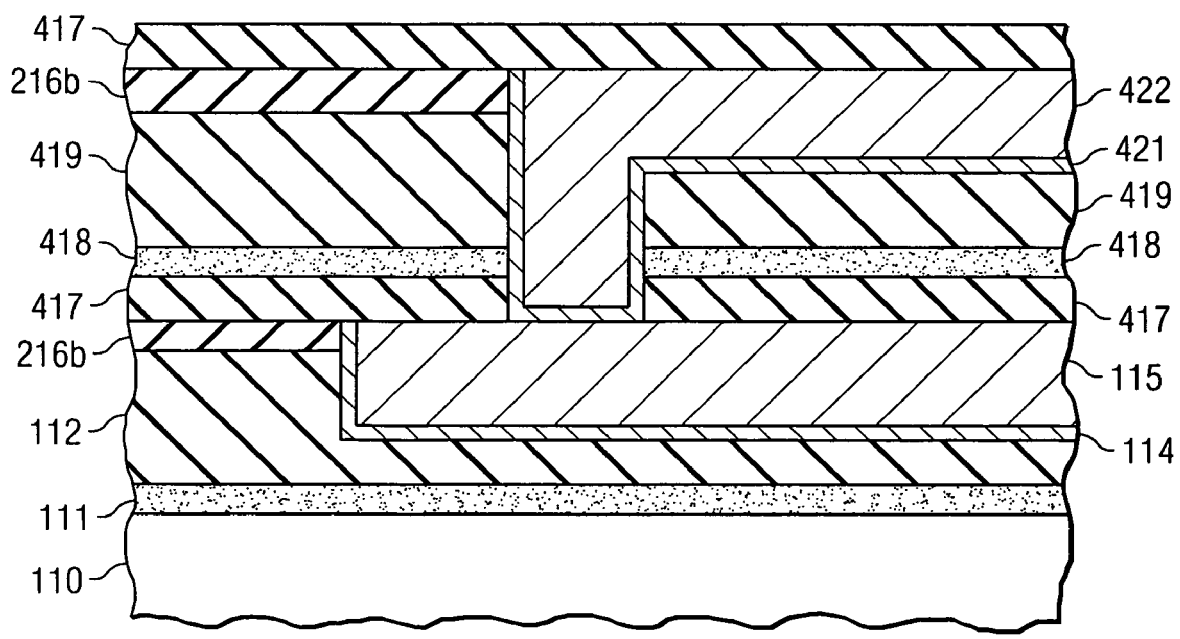

Turning now to FIG. 6, a dielectric protection layer 216b may be formed on the ILD layer 422 in the same manner as described above in connection with FIGS. 3a and 3b. The interconnect structure may be completed by performing an oxide removal operation and by forming a capping layer 417 as provided above.

The interconnect structure of FIG. 6 is provided to illustrate a useful application of an embodiment of the invention. However, other applications are within the scope of embodiments of the invention. For example, embodiments are not limited to damascene interconnect structures, as the inventions relates more generally to the protection of dielectric layers from processing damage. For example, an embodiment provides a method of protecting a dielectric layer from plasma damage caused by a semiconductor manufacturing process. Such a method may comprise forming a dielectric layer over a substrate and exposing a surface of the dielectric layer to a plasma in a process chamber for a short period. The period may be less than about 30 seconds, and more preferably less than about 2 seconds. Next, the plasma is shut off. Next, the method preferably includes flowing gaseous precursors over the surface of the dielectric activated by the plasma. Preferred precursors include at least one of $SiH_4$ or 3MS.

One application wherein embodiments of the invention are particularly advantageous is in the plasma deposition of capping or diffusion barrier layers. For example, another embodiment of the invention provides a method of forming a capping layer on a conductor of a semiconductor device. A method comprises providing an partially fabricated semiconductor device having a surface that includes an exposed conductor surface and an exposed dielectric surface. The method includes forming an organosilane layer on the dielectric. A preferred method of forming the organosilane layer comprises activating the exposed dielectric surface with a flash plasma process, shutting off the plasma, and flowing a silane over the activated dielectric surface after shutting off the plasma. Oxide may be removed by cleaning the exposed conductor surface through exposure of the partially fabricated semiconductor to a reducing plasma. Preferred embodiments include depositing a diffusion barrier layer on the organosilane layer and on the exposed conductor surface. The organosilane may remain as a detectable element of the completed semiconductor device. Alternatively, it may combine with the diffusion barrier layer, thereby forming a substantially homogeneously layer.

Although the present invention and its advantages have been described in detail, it should be understood that various changes, substitutions and alterations may be made herein without departing from the spirit and scope of the invention as defined by the appended claims. For example, it will be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of fabricating a semiconductor device, the method comprising:
   providing a substrate having active devices formed therein;
   forming an ILD (inter-layer dielectric) over the substrate, said ILD comprising a first region and a remaining region, said first region comprising at least one trench filled with a conductive material, and said remaining region having a top surface that is not protected by a hard mask;
   exposing said top surface of the remaining region of the ILD to a plasma subsequent to forming said ILD layer and said conductive filled trenches, thereby forming a chemically reactive top surface in said remaining region, wherein the plasma modifies a surface region of said remaining region to form the chemically reactive top surface without depositing another material layer;
   turning off the plasma after forming the chemically reactive surface; and
   exposing the chemically reactive top surface to a gaseous precursor after turning off the plasma, thereby reacting the gaseous precursor with chemically reactive surface to form a protected top surface in said remaining region of said ILD, wherein the protected top surface is not formed over the first region during the exposing.

2. The method of claim 1, wherein the chemically reactive surface includes molecules having dangling bonds.

3. The method of claim 1, wherein the gaseous precursor is selected from the group consisting essentially of $SiH_4$, $NH_3$, $N_2$, trimethylsilane (3MS), diethoxymethylsilane (DEMS), tetramethylsilane (4MS), and combinations thereof.

4. The method of claim 3, wherein the gaseous precursor comprises 3MS having a flow rate between about 300 sccm and about 500 sccm.

5. The method of claim 3, wherein the gaseous precursor comprises $SiH_4$ having a flow between about 200 sccm and about 400 sccm.

6. The method of claim 3, wherein exposing the chemically reactive top surface to a gaseous precursor has an exposure duration of less than about 30 seconds.

7. The method of claim 1, wherein reacting the gaseous precursor with said chemically reactive top surface forms an organosilane region less than about 10 nm thick at the surface of the dielectric layer.

8. The method of claim 1, further comprising forming a capping layer on the protected top surface of said ILD using a plasma deposition process.

9. The method of claim 8, wherein the capping layer comprises silicon nitride.

10. The method of claim 1, further comprising turning off the plasma after exposing the surface of the dielectric layer to the plasma for less than about 2 seconds.

11. The method of claim 1 wherein said ILD material is selected from the group consisting of carbon-doped silicon dioxide, fluorinated silicate glass (FSG), organic polymeric thermoset materials, silicon oxycarbide, SiCOH dielectrics, fluorine doped silicon oxide, spin on glasses, silsesquioxanes, benzacyclobutene (BCB)-based polymer dielectrics, and silicon containing low-k dielectrics.

12. The method of claim 11 wherein said ILD layer is formed of a porous dielectric material.

13. The method of claim 12 wherein said ILD layer is formed of a porous dielectric material.

14. A method of protecting a dielectric layer from plasma damage caused by a semiconductor manufacturing process, the method comprising:
    forming an ILD (inter-layer dielectric) layer over a substrate, said ILD comprising a first region and a remaining region, said first region comprising at least one trench filled with a conductive material, and said remaining region having a top surface that is not protected by a hardmask;
    exposing said top surface of the remaining region of the dielectric layer to a plasma in a process chamber for less than about two seconds, said exposing occurring subsequent to forming said ILD layer and said conductive filled trenches;
    shutting off the plasma; and
    flowing a gas comprising at least one of $SiH_4$ and trimethylsilane (3MS) into the process chamber after shutting off the plasma to form a protected top surface in said remaining region of said ILD, wherein the protected top surface is not formed over the first region.

15. The method of claim 14, wherein exposing the surface of the dielectric layer to the plasma comprises:
    heating the substrate to between about 300° C. and about 400° C., at a pressure between about 1 torr and about 10 torr, an RF power between about 10 W and about 1000 W.

16. The method of claim 14, wherein the gas further comprises a component selected from the group consisting essentially of $NH_3$, $N_2$, diethoxymethylsilane (DBMS), tetramethylsilane (4MS), and combinations thereof.

17. The method of claim 14, wherein flowing the gas is performed with process conditions comprising:
    a chamber pressure of between about 1 torr and about 10 torr, a substrate temperature between about 300° C. and about 400° C., and a duration of less than about 30 seconds.

18. The method of claim 14 wherein said ILD material is selected from the group consisting of carbon-doped silicon dioxide, fluorinated silicate glass (FSG), organic polymeric thermoset materials, silicon oxycarbide, SiCOH dielectrics, fluorine doped silicon oxide, spin on glasses, silsesquioxanes, benzacyclobutene (BCB)-based polymer dielectrics, and silicon containing low-k dielectrics.

19. The method of claim 18 wherein said ILD layer is formed of a porous dielectric material.

20. The method of claim 14, wherein the plasma modifies a surface region of said remaining region without depositing another material layer.

21. A method of forming a capping layer on a conductor of a semiconductor device, the method comprising:
    providing an partially fabricated semiconductor device having a surface, the surface comprising an exposed conductor surface as a first region, and a remaining region having an exposed ILD (inter-layer dielectric) surface that is not protected by a hardmask;
    forming an organosilane layer on the remaining region of the ILD surface but not over the first region comprising the exposed conductor surface, subsequent to providing said exposed conductor surface, and wherein forming the organosilane layer comprises activating the exposed remaining region of the ILD surface with a flash plasma process, shutting off the plasma, and flowing a silane over the activated ILD surface after shutting off the plasma;
    cleaning the exposed conductor surface by exposing the partially fabricated semiconductor to a reducing plasma; and
    depositing a diffusion barrier layer on the organosilane layer and on the exposed conductor surface.

22. The method of claim 21, wherein the organosilane layer comprises a siloxane monolayer.

23. The method of claim 21, wherein the diffusion barrier layer is silicon nitride.

24. The method of claim 21, wherein the flash plasma process comprises a temperature between about 300° C. and about 400° C., at a pressure between about 1 torr and about 10 torr, and an RF power between about 10 W and about 1000 W.

25. The method of claim 21, further comprising shutting off the plasma after activating the exposed dielectric layer for less than about 2 seconds.

26. The method of claim 21 wherein said ILD material is selected from the group consisting of carbon-doped silicon dioxide, fluorinated silicate glass (FSG), organic polymeric thermoset materials, silicon oxycarbide, SiCOH dielectrics, fluorine doped silicon oxide, spin on glasses, silsesquioxanes, benzacyclobutene (BCB)-based polymer dielectrics, and silicon containing low-k dielectrics.

27. The method of claim 21, wherein the plasma modifies a surface region of said remaining region without depositing another material layer.

\* \* \* \* \*